(12) United States Patent
Kim (10) Patent No.: US 10,713,114 B2
(45) Date of Patent: Jul. 14, 2020

(54) MEMORY MODULE AND OPERATION METHOD OF THE SAME

(71) Applicant: SK hynix Inc., Gyeonggi-do (KR)

(72) Inventor: Hyun-Seok Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 72 days.

(21) Appl. No.: 15/897,265

(22) Filed: Feb. 15, 2018

(65) Prior Publication Data

US 2018/0336092 A1 Nov. 22, 2018

(30) Foreign Application Priority Data

May 22, 2017 (KR) .................. 10-2017-0062754

(51) Int. Cl.
| | | |
|---|---|---|
| G06F 11/00 | (2006.01) | |
| G06F 11/10 | (2006.01) | |
| G06F 12/084 | (2016.01) | |
| G06F 3/06 | (2006.01) | |
| G11C 29/52 | (2006.01) | |

(52) U.S. Cl.
CPC ........ *G06F 11/1068* (2013.01); *G06F 3/0611* (2013.01); *G06F 3/0656* (2013.01); *G06F 3/0658* (2013.01); *G06F 3/0683* (2013.01); *G06F 11/1048* (2013.01); *G06F 12/084* (2013.01); *G11C 29/52* (2013.01); *G06F 2212/1024* (2013.01); *G06F 2212/1032* (2013.01); *G06F 2212/161* (2013.01); *G06F 2212/171* (2013.01)

(58) Field of Classification Search
CPC ............. G06F 11/1068; G06F 11/1048; G06F 3/0683; G06F 3/0658; G06F 3/0656; G06F 3/0611; G06F 12/084; G06F 2212/1032; G06F 2212/1024; G06F 2212/171; G06F 2212/161; G11C 29/52
USPC .......................................... 714/763, 764, 767
See application file for complete search history.

(56) References Cited

U.S. PATENT DOCUMENTS

| | | | | |
|---|---|---|---|---|
| 8,626,997 | B2 * | 1/2014 | Qawami | ............... G11C 11/005 711/105 |
| 2008/0201626 | A1 * | 8/2008 | Sturm | ................. G06F 11/1052 714/763 |
| 2011/0161600 | A1 * | 6/2011 | Hirano | ................ G06F 9/30043 711/141 |
| 2011/0239081 | A1 * | 9/2011 | Hida | .................... G06F 11/1012 714/755 |
| 2014/0289469 | A1 * | 9/2014 | Ishii | .................... G06F 12/1045 711/119 |
| 2014/0317469 | A1 * | 10/2014 | Sohn | .................... G11C 29/848 714/764 |

(Continued)

*Primary Examiner* — Albert Decady
*Assistant Examiner* — Osman M Alshack
(74) *Attorney, Agent, or Firm* — IP & T Group LLP (57) ABSTRACT

A memory module includes a plurality of main memory groups each suitable for storing user data and related ECC data; a cache memory group suitable for caching the user data of one among the main memory groups; an access controller suitable for accessing the main memory groups when user data to be accessed is not cached in the cache memory group; and an ECC unit suitable for performing an ECC operation for user data stored or to be stored in the main memory groups during an access operation for the user data stored or to be stored in the main memory groups.

16 Claims, 4 Drawing Sheets

(56) References Cited

U.S. PATENT DOCUMENTS

| | | | |
|---|---|---|---|
| 2016/0034398 A1* | 2/2016 | Wendel | G06F 12/084 711/129 |
| 2016/0117219 A1* | 4/2016 | Halbert | G06F 11/1004 714/799 |
| 2016/0147600 A1* | 5/2016 | Gao | G06F 11/1068 714/764 |
| 2016/0147623 A1* | 5/2016 | Ping | G06F 12/1009 714/6.13 |
| 2017/0147262 A1* | 5/2017 | Lee | G06F 3/0604 |
| 2017/0242585 A1* | 8/2017 | Eguchi | G06F 3/061 |
| 2018/0210787 A1* | 7/2018 | Bains | G06F 11/1068 |

* cited by examiner

MEMORY MODULE AND OPERATION METHOD OF THE SAME

CROSS-REFERENCE TO RELATED APPLICATION

This application claims priority under 35 U.S.C. § 119 to Korean Patent Application No. 10-2017-0062754 filed on May 22, 2017, the disclosure of which is incorporated herein by reference in its entirety.

TECHNICAL FIELD

Various exemplary embodiments of the present disclosure generally relate to a memory module.

DISCUSSION OF THE RELATED ART

In recent years, as mobile communication terminals such as smart phones and tablet PCs have become popular and the use of social network services (SNS), machine to machine (M2M) networks, and sensor networks has increased, the amounts, generation speeds and diversity of data are increasing exponentially.

For the processing of big data, not only the speed of a memory is important, but also the storage capacities of a memory device and a memory module including the memory device are required to be very large.

SUMMARY

Various embodiments are directed to providing a technology for enabling a quick access to a memory module while increasing the capacity of the memory module.

In an embodiment, a memory module may include: a plurality of first memory devices; at least one second memory device suitable for caching a part of data stored in the plurality of first memory devices; an access control circuit suitable for accessing the at least one second memory device when a region of the plurality of first memory devices for a host memory controller to access is cached in the at least one second memory device, and accessing the plurality of first memory devices otherwise; an error correction code generation circuit suitable for generating, by using write data transferred from the host memory controller in a write operation for the plurality of first memory devices, an error correction code to be stored together with the write data; and an error correction circuit suitable for correcting an error of read data read from the plurality of first memory devices in a read operation for the plurality of first memory devices, by using the error correction code read together with the read data.

In an embodiment, a method for operating a memory module including a plurality of first memory devices and at least one second memory device for caching a part of data stored in the plurality of first memory devices may include: receiving a request for performing a write operation for a first region of the plurality of first memory devices, from a host memory controller; checking whether the first region is a region which is cached in the at least one second memory device; writing write data received from the host memory controller, in the at least one second memory device, when the first region is a region which is cached in the at least one second memory device; generating an error correction code by using write data received from the host memory controller, when the first region is not a region which is cached in the at least one second memory device; and writing the write data received from the host memory controller and the error correction code in the first region of the plurality of first memory devices.

DETAILED DESCRIPTION

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
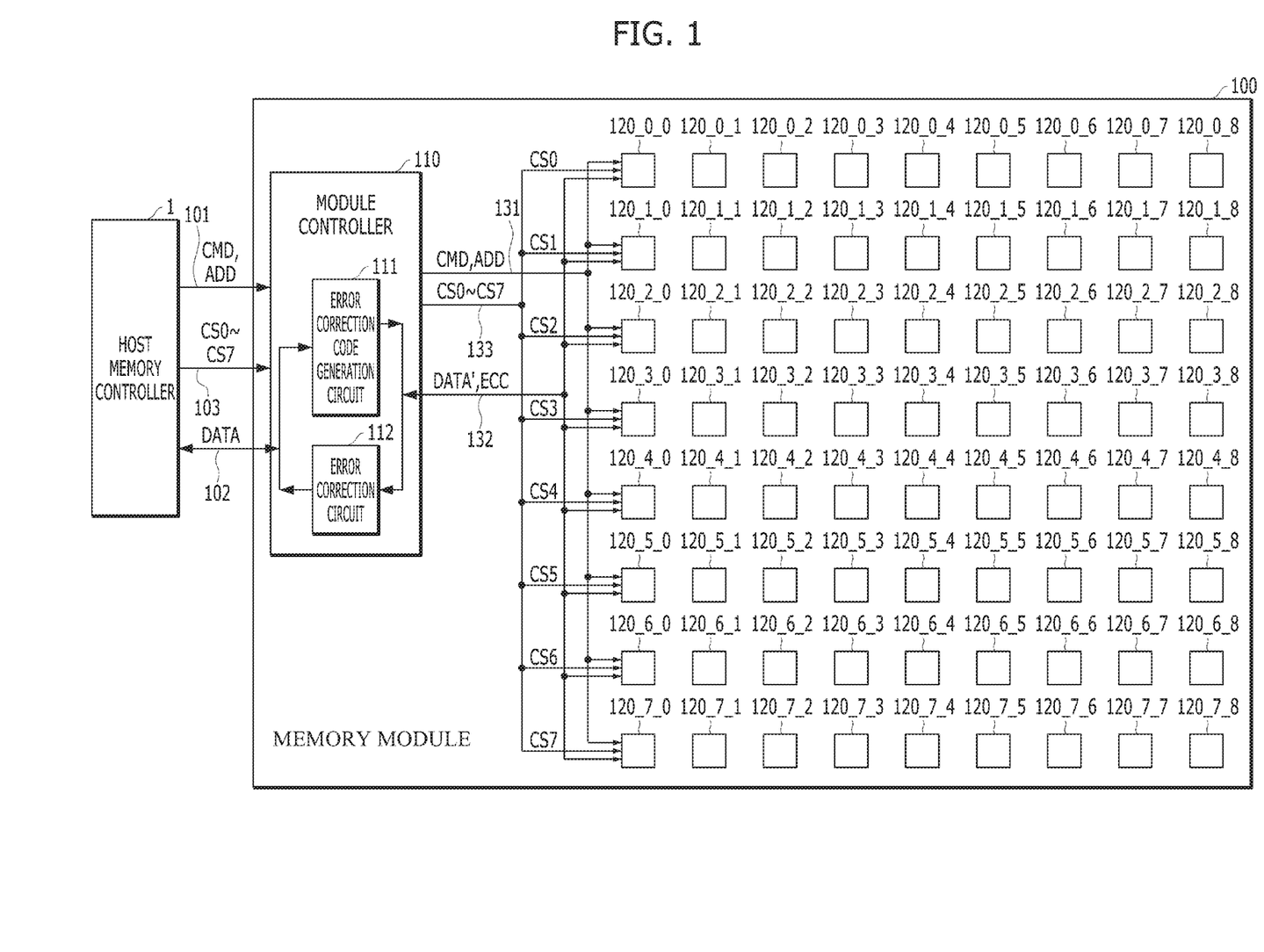
FIG. 1 is a diagram illustrating an exemplary configuration of a memory module in accordance with an embodiment of the present disclosure.

FIG. 1 is a diagram illustrating an exemplary configuration of a memory module 100 in accordance with an embodiment of the present disclosure. For the purposes of illustration and explanation, a host memory controller 1, which controls the memory module 100, is shown.

The host memory controller 1 may transmit a command CMD and an address ADD to the memory module 100 through a control bus 101. Further, the host memory controller 1 may transmit and receive data DATA to and from the memory module 100 through a data bus 102. Moreover, the host memory controller 1 may transmit chip select signals CS0 to CS7 for selecting a rank to be accessed, to the memory module 100 through a rank selection bus 103. While the command CMD and the chip select signals CS0 to CS7 are shown separately, it is to be noted that the chip select signals CS0 to CS7 may be classified by the command CMD. Each of the control bus 101, the data bus 102, and the rank selection bus 103 may include a plurality of transmission lines.

The memory module 100 may include a module controller 110 and a plurality of memory devices 120_0_0 to 120_7_8. The memory module 100 may be a dual in-line memory module (DIMM) type.

Each of the plurality of memory devices 120_0_0 to 120_7_8 may be one of various kinds of memories such as a dynamic random access memory (DRAM), a phase change random access memory (PCRAM), and so forth. The plurality of memory devices 120_0_0 to 120_7_8 may be divided into eight ranks from a rank 0 to a rank 7. A middle number in the reference symbol of each of the memory devices 120_0_0 to 120_7_8 may indicate the rank of a corresponding memory device. For example, the memory device 120_1_2 may be included in the rank 1, and the memory device 120_3_1 may be included in the rank 3. Each of the rank 0 to the rank 7 may include nine memory devices. Among the rank 0 to the rank 7, a rank selected by one among the chip select signals CS0 to CS7 may be accessed. For example, the memory devices 120_1_0 to 120_1_8 of the rank 1 may be accessed when the chip select signal CS1 is activated, and the memory devices 120_7_0 to 120_7_8 of the rank 7 may be accessed when the chip select signal CS7 is activated. The number of ranks included in the memory module 100 and the number of memory devices included in each rank are merely shown as examples in FIG. 1, and it is noted that the present disclosure is not limited thereto. That is, the number of ranks and the number of memory devices included in each rank may be different from FIG. 1.

The module controller 110 may receive the command CMD and the address ADD from the host memory controller 1 through the control bus 101, receive the chip select signals CS0 to CS7 from the host memory controller 1 through the rank selection bus 103, and transmit and receive data DATA to and from the host memory controller 1 through the data bus 102. That is to say, the module controller 110 may serve as an interface between the plurality of memory devices 120_0_0 to 120_7_8 and the host memory controller 1. The module controller 110 may buffer the command CMD, the address ADD, and the chip select signals CS0 to CS7 received from the host memory controller 1, and transfer them to the memory devices 120_0_0 to 120_7_8 through an internal control bus 131 and an internal rank selection bus 133.

In this process, the module controller 110 may control the timings of the signals CMD, ADD, and CS0 to CS7 transferred to the memory devices 120_0_0 to 120_7_8.

The module controller 110 may include an error correction code generation circuit 111 and an error correction circuit 112 for processing data in write and read operations.

The error correction code generation circuit 111 may generate an error correction code ECC by using write data DATA transferred from the host memory controller 1, in the write operation. In the write operation, write data DATA' (DATA=DATA' in the write operation) transferred from the host memory controller 1 and the error correction code ECC generated in the error correction code generation circuit 111 may be transferred to the memory devices 120_0_0 to 120_7_8 through an internal data bus 132. While each of the rank 0 to the rank 7 includes nine memory devices, the write data DATA' may be stored in eight memory devices among the nine memory devices, and the error correction code ECC may be stored in remaining one memory device in a selected one among the rank 0 to the rank 7. For example, when the rank 3 is selected, the write data DATA' may be written in memory cells selected by the address ADD in eight memory devices 120_3_0 to 120_3_7 of the rank 3, and the error correction code ECC may be written in memory cells selected by the address ADD in one memory device 120_3_8 of the rank 3.

The error correction circuit 112 may correct, by using the error correction code ECC read from a memory device of a rank selected among the rank 0 to the rank 7, an error of read data DATA' read from memory devices of the selected rank, in the read operation. Then, error-corrected read data DATA may be transferred to the host memory controller 1. For example, when the rank 2 is selected, the error correction circuit 112 may correct, by using the error correction code ECC read from memory cells selected by the address ADD in the memory device 120_2_8 of the rank 2, the error of read data DATA' read from memory cells selected by the address ADD in the memory devices 120_2_0 to 120_2_7 of the rank 2.

In order to reduce costs while increasing the capacity of the memory module 100 for the processing of big data, it is necessary to use memory devices of a large capacity with low manufacturing costs, which may result in having memory devices of relatively low quality. In other words, the memory devices 120_0_0 to 120_7_8 included in the memory module 100 may need to use relatively low-quality inexpensive products. Also, in order to reduce the current consumed in the memory module 100 of a high capacity, the refresh cycle of the memory devices 120_0_0 to 120_7_8 should be increased. In this case, errors may occur in the memory devices 120_0_0 to 120_7_8. In addition, in order to increase the capacity of the memory module 100, it is necessary to increase the number of the memory devices 120_0_0 to 120_7_8 included in the memory module 100. As the number of the memory devices 120_0_0 to 120_7_8 increases, since it is difficult to route a large number of signals in the memory module 100, the number of errors occurring in the memory devices 120_0_0 to 120_7_8 may increase. Thus, the error correction code generation circuit 111 and the error correction circuit 112 may be used to correct an error occurring in the memory devices 120_0_0 to 120_7_8.

Even though the error correction code generation circuit 111 and the error correction circuit 112 are capable of correcting an error occurring in the memory devices 120_0_0 to 120_7_8, the speeds of the read and write operations for the memory devices 120_0_0 to 120_7_8 may be decreased due to ECC operations. That is, latencies of the memory devices 120_0_0 to 120_7_8 related with the read and write operations may increase, because the process of generating the error correction code ECC by the error correction code generation circuit 111 before data DATA is written in the memory devices 120_0_0 to 120_7_8 is needed in the write operation and the process of correcting an error by the error correction circuit 112 before data DATA' read from the memory devices 120_0_0 to 120_7_8 is transferred to the host memory controller 1 is needed in the read operation.

Figure 2:
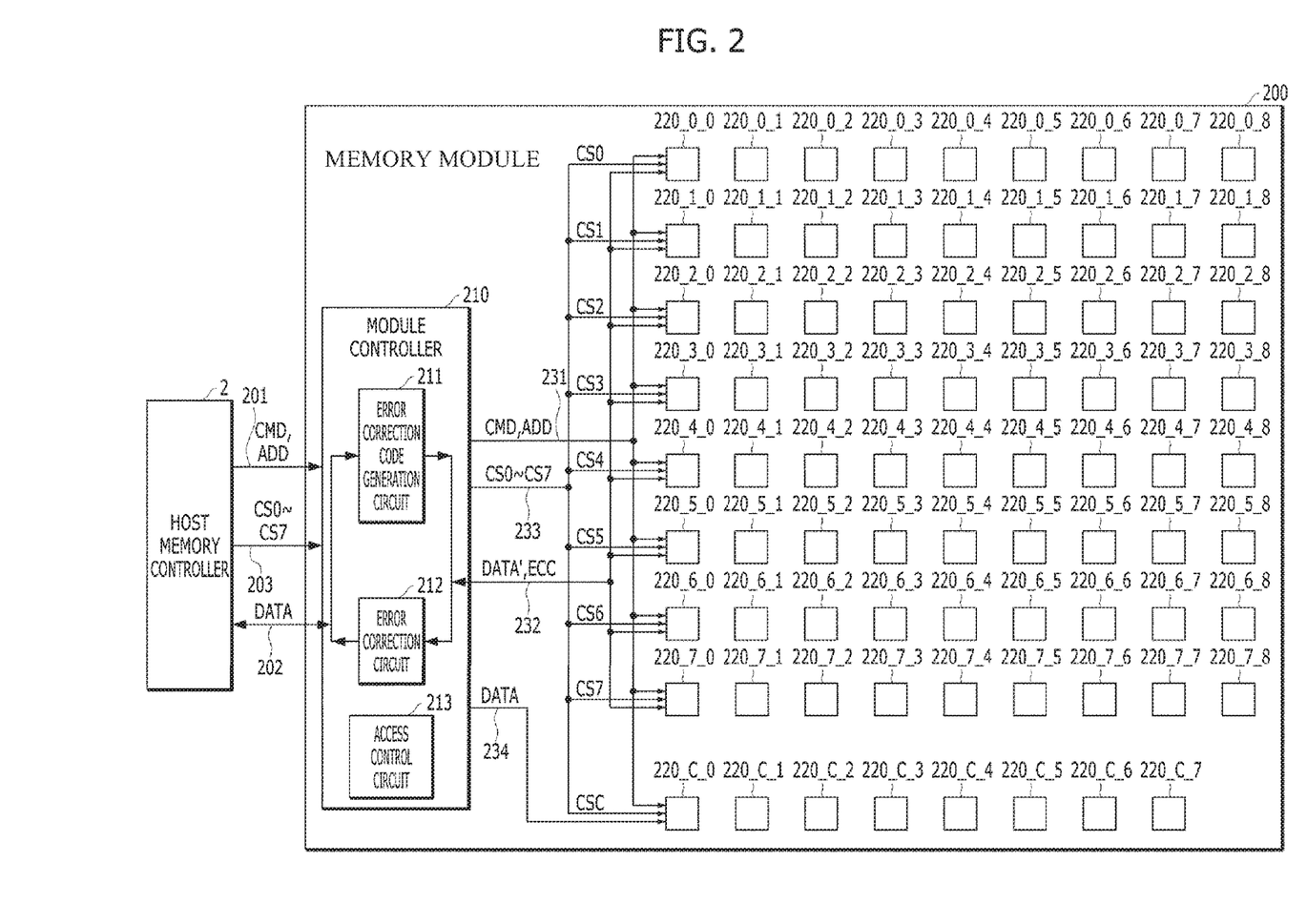
FIG. 2 is a diagram illustrating an exemplary configuration of a memory module in accordance with another embodiment of the present disclosure.

FIG. 2 is diagram illustrating an exemplary configuration of a memory module 200 in accordance with another embodiment of the present disclosure. For the purposes of illustration and explanation, a host memory controller 2 which controls the memory module 200 is shown.

The host memory controller 2 may transmit a command CMD and an address ADD to the memory module 200 through a control bus 201. Further, the host memory controller 2 may transmit and receive data DATA to and from the memory module 200 through a data bus 202. Moreover, the host memory controller 2 may transmit chip select signals CS0 to CS7 for selecting a rank to be accessed, to the memory module 200 through a rank selection bus 203. While the command CMD and the chip select signals CS0 to CS7 are shown separately, it is to be noted that the chip select signals CS0 to CS7 may be classified by the command CMD. Each of the control bus 201, the data bus 202 and the rank selection bus 203 may include a plurality of transmission lines.

The memory module 200 may include a module controller 210, a plurality of first memory devices 220_0_0 to 220_7_8 and a plurality of second memory devices 220_C_0 to 220_C_7. The memory module 200 may be a dual in-line memory module (DIMM) type.

Each of the plurality of first memory devices 220_0_0 to 220_7_8 may be one of various kinds of memories such as a DRAM, a PCRAM, and so forth. The plurality of first memory devices 220_0_0 to 220_7_8 may be divided into eight ranks from a rank 0 to a rank 7. A middle number in the reference symbol of each of the first memory devices 220_0_0 to 220_7_8 may indicate the rank of a corresponding first memory device. For example, the first memory device 220_1_2 may be included in the rank 1, and the first memory device 220_3_1 may be included in the rank 3. Each of the rank 0 to the rank 7 may include nine first memory devices. Among the rank 0 to the rank 7, a rank selected by one among the chip select signals CS0 to CS7 chip select signal may be accessed. For example, the first memory devices 220_1_0 to 220_1_8 of the rank 1 may be accessed when the chip select signal CS1 is activated, and the first memory devices 220_7_0 to 220_7_8 of the rank 7 may be accessed when the chip select signal CS7 is activated.

The plurality of second memory devices 220_C_0 to 220_C_7 may cache data stored in the first memory devices of a single rank among the plurality of first memory devices 220_0_0 to 220_7_8. For example, the second memory devices 220_C_0 to 220_C_7 may cache data stored in the first memory devices 220_5_0 to 220_5_8 of the rank 5. When accessing the plurality of second memory devices 220_C_0 to 220_C_7, that is, in write and read operations for the plurality of second memory devices 220_C_0 to 220_C_7, an error correction operation may not be performed to data of the plurality of second memory devices 220_C_0 to 220_C_7. That is to say, an error correction code generation circuit 211 and an error correction circuit 212 may not be used and be deactivated when accessing the second memory devices 220_C_0 to 220_C_7. Since an error correction code ECC need not be stored in the second memory devices 220_C_0 to 220_C_7, the eight second memory devices 220_C_0 to 220_C_7 may cache data stored in nine first memory devices belonging to a single rank. The second memory devices 220_C_0 to 220_C_7 may be the same kind of memories as the first memory devices 220_0_0 to 220_7_8. For example, if the first memory devices 220_0_0 to 220_7_8 are DRAMs, the second memory devices 220_C_0 to 220_C_7 may be DRAMs as well.

Because an error correction operation is not performed on the second memory devices 220_C_0 to 220_C_7 when accessing the second memory devices 220_C_0 to 220_C_7, unlike when accessing the first memory devices 220_0_0 to 220_7_8, the error rate of the second memory devices 220_C_0 to 220_C_7 should be much lower than the error rate of the first memory devices 220_0_0 to 220_7_8 or no error should occur in the second memory devices 220_C_0 to 220_C_7. In other words, the second memory devices 220_C_0 to 220_C_7 need to be memories of a higher quality than those of the first memory devices 220_0_0 to 220_7_8. For example, if memory devices are manufactured through the same manufacturing process, memory devices having the best quality after testing may be used as the second memory devices 220_C_0 to 220_C_7, and memory devices of lesser quality may be used as the first memory devices 220_0_0 to 220_7_8.

The module controller 210 may receive the command CMD and the address ADD from the host memory controller 2 through the control bus 201, receive the chip select signals CS0 to CS7 from the host memory controller 2 through the rank selection bus 203, and transmit and receive data DATA to and from the host memory controller 2 through the data bus 202. That is to say, the module controller 210 may serve as an interface between the memory module 200 and the host memory controller 2. The module controller 210 may buffer the command CMD and the address ADD received from the host memory controller 2, and transfer them to the first memory devices 220_0_0 to 220_7_8 and the second memory devices 220_C_0 to 220_C_7 through an internal control bus 231.

In this process, the module controller 210 may control the timings of the signals CMD and ADD transferred to the first memory devices 220_0_0 to 220_7_8 and the second memory devices 220_C_0 to 220_C_7. Since a longer latency is required when the first memory devices 220_0_0 to 220_7_8 are accessed compared to when the second memory devices 220_C_0 to 220_C_7 are accessed, timings at which the signals CMD and ADD are transferred may be controlled differently depending on whether the first memory devices 220_0_0 to 220_7_8 are accessed or the second memory devices 220_C_0 to 220_C_7 are accessed.

The module controller 210 may include an access control circuit 213, an error correction code generation circuit 211, and an error correction circuit 212.

The access control circuit 213 may include a table storing which rank among the rank 0 to the rank 7 is cached in the second memory devices 220_C_0 to 220_C_7. A rank among the rank 0 to the rank 7 which is to be cached in the second memory devices 220_C_0 to 220_C_7 may depend on access frequency of the rank 0 to the rank 7. In the case the host memory controller 2 is going to access a rank which is cached in the second memory devices 220_C_0 to 220_C_7, the access control circuit 213 may access the second memory devices 220_C_0 to 220_C_7. Namely, the access control circuit 213 may activate a chip select signal CSC for selecting the second memory devices 220_C_0 to 220_C_7 among chip select signals CS0 to CS7 and CSC transferred to an internal rank selection bus 233, transfer the command CMD and the address ADD to the second memory devices 220_C_0 to 220_C_7 through the internal control bus 231, and transmit and receive data DATA to and from the second memory devices 220_C_0 to 220_C_7 through a second internal data bus 234.

In the case where the host memory controller 2 is going to access a rank which is not cached in the second memory devices 220_C_0 to 220_C_7, the access control circuit 213 may access one among the first memory devices 220_0_0 to 220_7_8. In this case, a chip select signal activated on the rank selection bus 203 and a chip select signal activated on the internal rank selection bus 233 may be the same, and the chip select signal CSC may be deactivated. For example, when the chip select signal CS1 is activated on the rank selection bus 203, the chip select signal CS1 may be activated also on the internal rank selection bus 233 and the first memory devices 220_1_0 to 220_1_8 of the rank 1 may be accessed, and the chip select signal CSC may be deactivated and the second memory devices 220_C_0 to 220_C_7 may not be accessed.

The error correction code generation circuit 211 may generate the error correction code ECC by using write data DATA transferred from the host memory controller 2, in the write operation for the first memory devices 220_0_0 to 220_7_8. In the write operation for the first memory devices 220_0_0 to 220_7_8, write data DATA' (DATA=DATA' in the write operation) transferred from the host memory controller 2 and the error correction code ECC generated in the error correction code generation circuit 211 may be transferred to the first memory devices 220_0_0 to 220_7_8 through a first internal data bus 232. While each of the rank 0 to the rank 7 includes nine first memory devices, the write data DATA' may be stored in eight first memory devices among the nine first memory devices, and the error correction code ECC may be stored in remaining one first memory device in a selected one among the rank 0 to the rank 7. For example, when the rank 3 is selected, the write data DATA' may be written in memory cells selected by the address ADD in eight first memory devices 220_3_0 to 220_3_7 of the rank 3, and the error correction code ECC may be written in memory cells selected by the address ADD in one first memory device 220_3_8 of the rank 3.

The error correction circuit 212 may correct, by using the error correction code ECC read from a first memory device of a rank selected among the rank 0 to the rank 7, an error of read data DATA' read from first memory devices of the selected rank, in the read operation for the first memory devices 220_0_0 to 220_7_8. Then, error-corrected read data DATA may be transferred to the host memory controller 2. For example, when the rank 2 is selected, the error correction circuit 212 may correct, by using the error correction code ECC read from memory cells selected by the address ADD in the first memory device 220_2_8 of the rank 2, the error of read data DATA' read from memory cells selected by the address ADD in the first memory devices 220_2_0 to 220_2_7 of the rank 2.

In the memory module 200 of FIG. 2, data of first memory devices of one rank accessed frequently among the first memory devices 220_0_0 to 220_7_8 whose access speeds are relatively low due to the ECC operation are cached in the second memory devices 220_C_0 to 220_C_7, and the second memory devices 220_C_0 to 220_C_7 are quickly accessed without the ECC operation, which increases the operation speed of the memory module 200.

While it is illustrated that data of one rank among the first memory devices 220_0_0 to 220_7_8 are cached in the second memory devices 220_C_0 to 220_C_7, it is to be noted that the unit of data to be cached need not be a rank unit and data may be cached by a bank unit or a smaller unit. For example, data of specified banks (for example, banks 3) of all ranks of the first memory devices 220_0_0 to 220_7_8 may be cached in the second memory devices 220_C_0 to 220_C_7. Also, although first memory devices 220_0_0 to 220_7_8 and second memory devices 220_0_0 to 220_C_7 are shown in FIG. 2, the present disclosure is not limited to those numbers of memory devices. That is, it is noted that the number of the first memory devices 220_0_0 to 220_7_8 and the number of second memory devices 220_C_0 to 220_C_7 included in the memory module 200 may be different from the illustration of FIG. 2. Moreover, while it is illustrated in FIG. 2 that the access control circuit 213, the error correction code generation circuit 211, and the error correction circuit 212 are all included in the module controller 210, the present disclosure is not limited thereto. That is, it is to be noted that at least one among the access control circuit 213, the error correction code generation circuit 211, and the error correction circuit 212 may be positioned outside the module controller 210.

Since an error correction operation is not performed when accessing the second memory devices 220_C_0 to 220_C_7, errors occurring in the second memory devices 220_C_0 to 220_C_7 should be reduced, and it is important to increase the access speed of the second memory devices 220_C_0 to 220_C_7 since they are used as a kind of cache. In order to reduce errors of the second memory devices 220_C_0 to 220_C_7 occurring in the routing of signals and increase the access speed of the second memory devices 220_C_0 to 220_C_7, a package including the second memory devices 220_C_0 to 220_C_7 may be stacked over the package of the module controller 210 in the form of a package over package (PoP). Since an error correction operation for the second memory devices 220_C_0 to 220_C_7 is not performed, when the first memory devices 220_0_0 to 220_7_8 and the second memory devices 220_C_0 to 220_C_7 are DRAMs, the second memory devices 220_C_0 to 220_C_7 may have a shorter refresh cycle.

Figure 3:
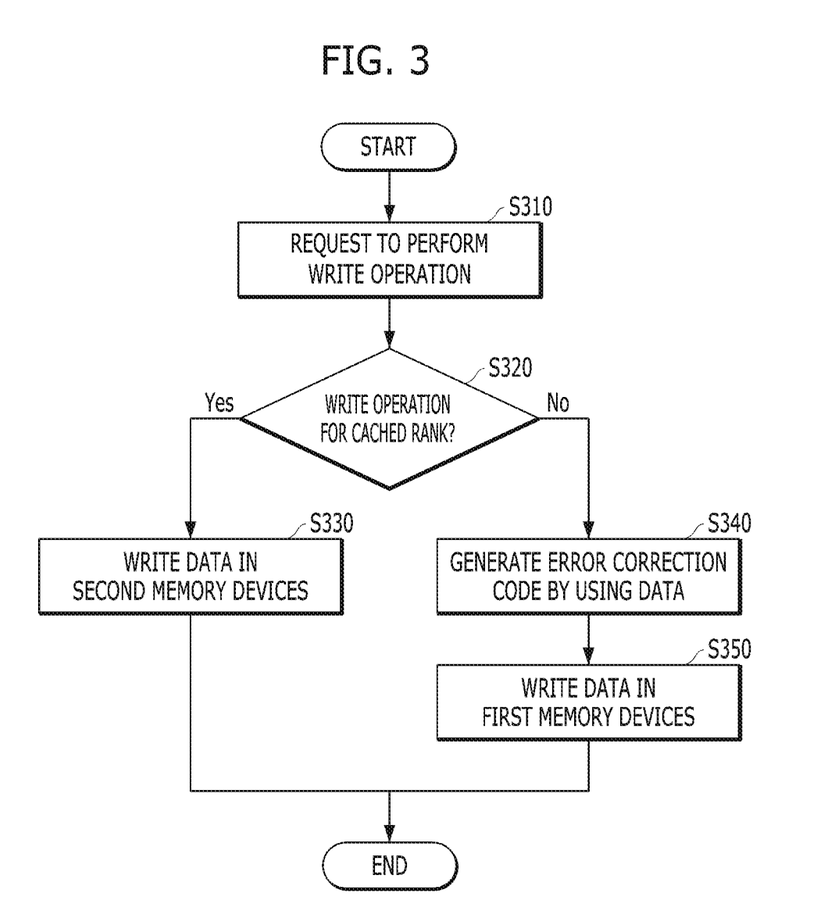
FIG. 3 is a flow chart describing the write operation of the memory module shown in FIG. 2.

FIG. 3 is a flow chart describing the write operation of the memory module 200 shown in FIG. 2. It is assumed, for the convenience in illustration and explanation, that data of the first memory devices 220_4_0 to 220_4_8 of the rank 4 among the first memory devices 220_0_0 to 220_7_8 included in the memory module 200 are cached in the second memory devices 220_C_0 to 220_C_7.

Referring to FIG. 3, at step S310, the performing of a write operation may be requested to the memory module 200 from the host memory controller 2. The request to perform the write operation may be executed as the host memory controller 2 transfers the command CMD instructing the write operation and the address ADD designating memory cells for which the write operation is to be performed, to the memory module 200 through the control bus 201, transfers write data DATA to the memory module 200 through the data bus 202 and activates a chip select signal corresponding to a rank for which the write operation is to be performed, among the chip select signals CS0 to CS7 on the rank selection bus 203.

At step S320, the access control circuit 213 of the memory module 200 may determine whether a rank for which the host memory controller 2 is to perform the write operation is the rank cached in the second memory devices 220_C_0 to 220_C_7. In this particular case, the access control circuit 213 may determine whether it is rank 4 or not. This may be executed by determining whether the chip select signal activated in the step S310 is the chip select signal CS4 corresponding to the rank 4 or not.

In the case where it is determined at the step S320 that a rank for the host memory controller 2 to access is the rank cached in the second memory devices 220_C_0 to 220_C_7, that is, rank 4 ("Yes" at the step S320), the write operation may be performed for the second memory devices 220_C_0 to 220_C_7 at step S330. This may be executed as the module controller 210 transfers the command CMD instructing the write operation and the address ADD designating memory cells for which the write operation is to be performed, to the second memory devices 220_C_0 to 220_C_7 through the internal control bus 231, activates the chip select signal CSC on the internal rank selection bus 233 and transfers data DATA to be written, to the second memory devices 220_C_0 to 220_C_7 through the second internal data bus 234 and the data DATA is written in the memory cells selected by the address ADD in the second memory devices 220_C_0 to 220_C_7. The write operation on the second memory devices 220_C_0 to 220_C_7 may be quickly performed since it is performed without the ECC operation.

In the case where it is determined at the step S320 that a rank for the host memory controller 2 to access is not the rank cached in the second memory devices 220_C_0 to 220_C_7 ("No" at the step S320), the error correction code generation circuit 211 may generate the error correction code ECC for the write data DATA at step S340. Then, the write operation may be performed for the first memory devices of a selected rank among the first memory devices 220_0_0 to 220_7_8 at step S350. This may be executed as the module controller 210 transfers the command CMD instructing the write operation and the address ADD designating memory cells for which the write operation is to be performed, to the first memory devices 220_0_0 to 220_7_8 through the internal control bus 231, activates a chip select signal corresponding to the selected rank among the chip select signals CS0 to CS7 on the internal rank selection bus 233 and transfers data DATA' to be written and the error correction code ECC, to the first memory devices 220_0_0 to 220_7_8 through the first internal data bus 232 and the data DATA' and the error correction code ECC are written in the memory cells selected by the address ADD in the first memory devices of the selected rank among the first memory devices 220_0_0 to 220_7_8.

While not shown in FIG. 3, dirty data among the data cached in the second memory devices 220_C_0 to 220_C_7 may be updated periodically with the first memory devices of a corresponding rank among the first memory devices 220_0_0 to 220_7_8. The dirty data may mean data in the case where the data cached in the second memory devices 220_C_0 to 220_C_7 and original data of corresponding first memory devices are different from each other.

Figure 4:
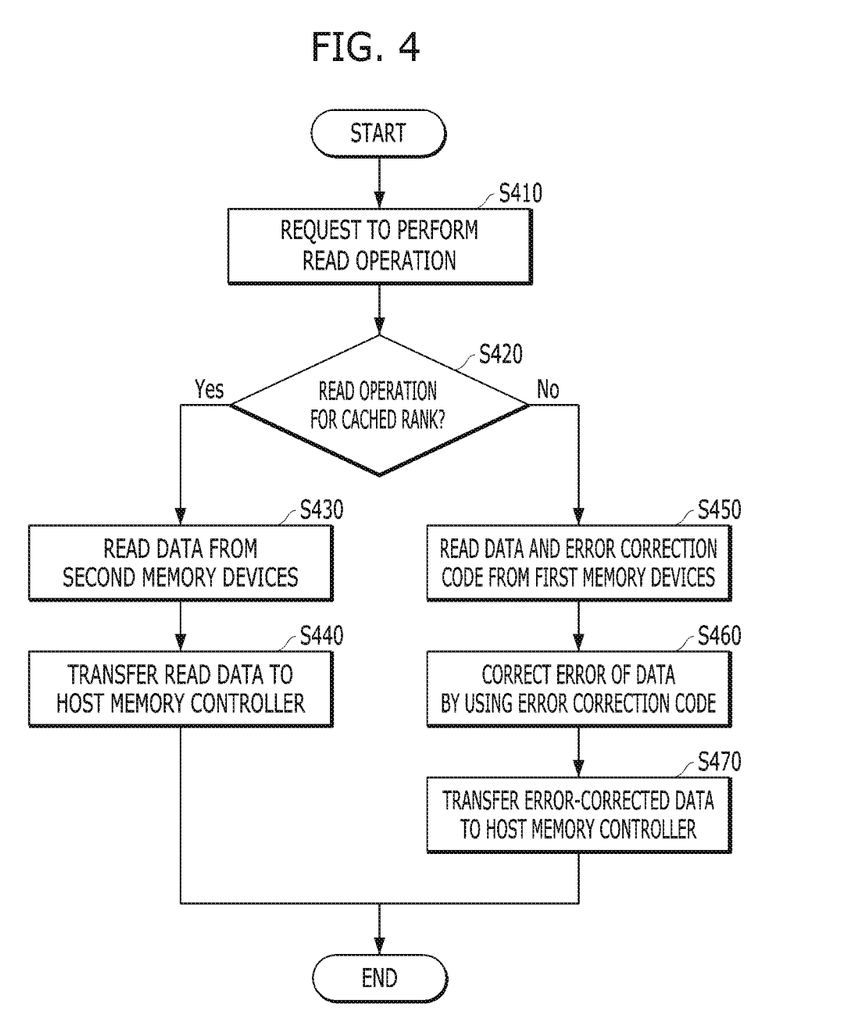
FIG. 4 is a flow chart describing the read operation of the memory module shown in FIG. 2.

FIG. 4 is a flow chart to assist in the explanation of the read operation of the memory module 200 shown in FIG. 2. It is assumed, for the convenience in illustration and explanation, that data of the first memory devices 220_4_0 to 220_4_8 of the rank 4 among the first memory devices 220_0_0 to 220_7_8 included in the memory module 200 are cached in the second memory devices 220_C_0 to 220_C_7.

Referring to FIG. 4, at step S410, the performing of a read operation may be requested to the memory module 200 from the host memory controller 2. The request to perform the read operation may be executed as the host memory controller 2 transfers the command CMD instructing the read operation and the address ADD designating memory cells for which the read operation is to be performed, to the memory module 200 through the control bus 201 and activates a chip select signal corresponding to a rank for which the read operation is to be performed, among the chip select signals CS0 to CS7 on the rank selection bus 203.

At step S420, the access control circuit 213 of the memory module 200 may determine whether a rank for which the host memory controller 2 is to perform the read operation is the rank cached in the second memory devices 220_C_0 to 220_C_7. In this particular case, the access control circuit 213 may determine whether it is rank 4 or not. This may be executed by determining whether the chip select signal activated in the step S410 is the chip select signal CS4 corresponding to the rank 4 or not.

In the case where it is determined at the step S420 that a rank for the host memory controller 2 to access is the rank cached in the second memory devices 220_C_0 to 220_C_7, that is, rank 4 ("Yes" at the step S420), the read operation may be performed on the second memory devices 220_C_0 to 220_C_7 at step S430. This may be executed as the module controller 210 transfers the command CMD instructing the read operation and the address ADD designating memory cells for which the read operation is to be performed, to the second memory devices 220_C_0 to 220_C_7 through the internal control bus 231 and activates the chip select signal CSC on the internal rank selection bus 233 and data DATA read from the second memory devices 220_C_0 to 220_C_7 is transferred to the module controller 210 through the second internal data bus 234 in response to the command CMD and the address ADD.

Then, at step S440, the data DATA read from the second memory devices 220_C_0 to 220_C_7 may be transferred to the host memory controller 2 through the data bus 202 from the module controller 210.

In the case where it is determined at the step S420 that a rank for the host memory controller 2 to access is not the rank cached in the second memory devices 220_C_0 to 220_C_7 ("No" at the step S420), the read operation may be performed on the first memory devices of a selected rank among the first memory devices 220_0_0 to 220_7_8 at step S450. This may be executed as the module controller 210 transfers the command CMD instructing the read operation and the address ADD designating memory cells for which the read operation is to be performed, to the first memory devices 220_0_0 to 220_7_8 through the internal control bus 231 and activates a chip select signal corresponding to the selected rank among the chip select signals CS0 to CS7 on the internal rank selection bus 233 and the data DATA' and the error correction code ECC read from the first memory devices of the selected rank among the first memory devices 220_0_0 to 220_7_8 are transferred to the module controller 210 through the first internal data bus 232.

At step S460, the error correction circuit 212 may correct an error of the data DATA' read at the step S450 by using the error correction code ECC read at the step S450.

At step S470, data DATA corrected by the error correction circuit 212 may be transferred to the host memory controller 2 through the data bus 202 from the module controller 210.

According to the various exemplary embodiments of the present disclosure, it is possible to enable a quick access to a memory module while increasing the capacity of the memory module.

Although various embodiments have been described for illustrative purposes, it will be apparent to those skilled in the art that various changes and modifications may be made without departing from the spirit and scope of the invention as defined in the following claims.

What is claimed is:

1. A memory module comprising:
   a plurality of first memory devices;
   at least one second memory device suitable for caching a part of data stored in the plurality of first memory devices;
   an access control circuit suitable for accessing the at least one second memory device when a region of the plurality of first memory devices for a host memory controller to access is cached in the at least one second memory device, and accessing the plurality of first memory devices otherwise;
   an error correction code generation circuit suitable for generating, by using write data transferred from the host memory controller in a write operation for the plurality of first memory devices, an error correction code to be stored together with the write data; and
   an error correction circuit suitable for correcting an error of read data read from the plurality of first memory devices in a read operation for the plurality of first memory devices, by using the error correction code read together with the read data,
   wherein the error correction code generation circuit and the error correction circuit are activated when the access control circuit accesses the plurality of first memory devices and deactivated when the access control circuit accesses the at least one second memory device, and
   wherein the error correction code generation circuit is deactivated in a write operation for accessing the cached data of the at least one second memory device, and the error correction circuit is deactivated in a read operation for accessing the cached data of the at least one second memory device.

2. The memory module according to claim 1, wherein the plurality of first memory devices and the at least one second memory device are the same kind of memories.

3. The memory module according to claim 2, wherein the at least one second memory device has an error occurrence rate lower than the plurality of first memory devices.

4. The memory module according to claim 2, wherein each of the plurality of first memory devices and the at least one second memory device is a dynamic random access memory (DRAM), and wherein the memory module is a dual in-line memory module (DIMM) type.

5. The memory module according to claim 4, wherein the at least one second memory device has a shorter refresh cycle than the plurality of first memory devices.

6. The memory module according to claim 1,
   wherein a read operation time of the plurality of first memory devices is longer than a read operation time of the at least one second memory device, and
   wherein a write operation time of the plurality of first memory devices is longer than a write operation time of the at least one second memory device.

7. The memory module according to claim 1,
   wherein the plurality of first memory devices are divided into N number of ranks, and
   wherein N is an integer equal to or greater than 2, and
   wherein the at least one second memory device caches data stored in first memory devices belonging to one rank among the N number of ranks.

8. The memory module according to claim 7, wherein the number of first memory devices included in each of the N number of ranks is greater than the number of the at least one second memory device.

9. The memory module according to claim 1, wherein the access control circuit, the error correction code generation circuit, and the error correction circuit are included in a module controller.

10. The memory module according to claim 9, wherein the at least one second memory device is stacked over the module controller in the form of a package over package (PoP).

11. A method for operating a memory module including a plurality of first memory devices and at least one second memory device for caching a part of data stored in the plurality of first memory devices, the method comprising:
   receiving a request for performing a write operation for a first region of the plurality of first memory devices, from a host memory controller;
   checking whether the first region is a region which is cached in the at least one second memory device;
   generating an error correction code by using write data received from the host memory controller, when the first region is not a region which is cached in the at least one second memory device; and
   writing the write data received from the host memory controller and the error correction code in the first region of the plurality of first memory devices,
   writing, while skipping of the generating of the error correction code, write data received from the host memory controller, in the at least one second memory device, when the first region is a region which is cached in the at least one second memory device, wherein the generating of the error correction code is skipped when the write data is to be written only in the at least one second memory device.

12. The method according to claim 11, further comprising:
   receiving a request for performing a read operation for a second region of the plurality of first memory devices, from the host memory controller;
   checking whether the second region is a region which is cached in the at least one second memory device;
   reading data and an error correction code from the second region of the plurality of first memory devices, when the second region is not a region which is cached in the at least one second memory device;

correcting, by using the error correction code read from the second region of the plurality of first memory devices, an error of the data read from the second region of the plurality of first memory devices, and providing the error-corrected data to the host memory controller; and reading data from the at least one second memory device, and providing, while skipping the correcting of an error of the data, the data to the host memory controller, when the second region is a region which is cached in the at least one second memory device.

13. The method according to claim 11, wherein the plurality of first memory devices and the at least one second memory device are the same kind of memories.

14. The method according to claim 13, wherein the at least one second memory device has an error occurrence rate lower than the plurality of first memory devices.

15. The method according to claim 14,
wherein each of the plurality of first memory devices and the at least one second memory device is a dynamic random access memory (DRAM), and
wherein the memory module is a DIMM (dual in-line memory module) type.

16. The method according to claim 15, wherein the at least one second memory device has a shorter refresh cycle than the plurality of first memory devices.

* * * * *